United States Patent [19]

Andreev et al.

[11] 4,180,402

[45] Dec. 25, 1979

[54] PROCESS FOR OBTAINING HALF-TONE PICTURE OF IRREGULAR STRUCTURE

[75] Inventors: Jury S. Andreev; Olga V. Pyasetskaya; Galina G. Leonova, all of Moscow, U.S.S.R.

[73] Assignee: Vsesojuzny Gosudarstvenny Nauchno-Issiedovatelsky I Proekthyinstitut Khimo-Forograficheskoi Promyshlennosti, U.S.S.R.

[21] Appl. No.: 855,783

[22] Filed: Nov. 28, 1977

[51] Int. Cl.² .................... G03F 7/02; G03C 5/30; G03C 1/02
[52] U.S. Cl. ............................. 430/394; 430/265; 430/567
[58] Field of Search .............. 96/66 R, 94 R, 107, 96/33, 50, 63, 45, 45.2; 250/475 F, 477, 478

[56] References Cited

U.S. PATENT DOCUMENTS

| Re. 26601 | 6/1969 | Allen | 96/66 |
|---|---|---|---|
| 2,566,265 | 8/1951 | Tuttle | 250/475 |
| 3,655,381 | 4/1972 | Roemer | 96/45 |
| 3,737,313 | 6/1973 | Rosecrants | 96/94 R |

*Primary Examiner*—Mary F. Kelley
*Attorney, Agent, or Firm*—Steinberg and Blake

[57] ABSTRACT

A process for obtaining a half-tone picture of irregular structure consists in exposing a coarse-grained silver-halide material with an average linear size of silver halide micro-crystals of 4 to 6 microns, developing the exposed material in an infectious developer, printing the resulting picture on a high-contrast photosensitive material, and developing the exposed high-contrast photosensitive material. The process permits obtaining a high-quality half-tone picture with the optical densities of the original being reproducible within the range of more than 1.0. The process is simple and easily controllable.

1 Claim, No Drawings

PROCESS FOR OBTAINING HALF-TONE PICTURE OF IRREGULAR STRUCTURE

FIELD OF THE INVENTION

The present invention relates to the art of printing, and more particularly to photomechanical reproduction. More specifically, the invention relates to processes for obtaining a half-tone picture of irregular structure.

BACKGROUND OF THE INVENTION

Known in the art is a process for obtaining a half-tone picture of irregular structure, comprising consecutive steps of exposing a negative of phototechnical silver-halide material with an average linear size of silver halide microcrystals of less than 1 micron, developing in a conventional black-and-white developer, softening in hot water or another liquid to a state close to that of fusion of the photographic layer, rinsing in cooled (8° to 10° C.) water, reducing in a solution containing an oxidizing agent, e.g., potassium ferrocyanide, and intensifying in a uranium salt solution.

This process is disadvantageous in that the gelatine silver-halide photographic layer becomes mottled, which results in process instability depending on the degree of hardening, storage time, photographic layer thickness and temperature difference.

Also known is a process for obtaining a half-tone picture of irregular structure, which consists in exposing a silver-halide material with an average linear size of silver halide microcrystals of about 0.5 microns, developing the exposed material in a conventional black-and-white developer, preparing a mask by way of exposure of the resulting picture on a silver-halide material, developing the exposed material in a conventional developer, matching the mask with the resulting picture, printing the matched mask and picture on a high-contrast photosensitive material, and developing the exposed high-contrast photosensitive material in a high-contrast developer.

A disadvantage of this process is that the contrast of the obtained half-tone picture is too high, the process is complicated and difficult to control.

According to another known process for obtaining a half-tone picture of irregular structure, the following sequence of steps is carried out: exposure of a silver-halide material, e.g., X-ray film, with an average linear size of silver halide microcrystals of 0.9 to 1.0 microns, development of the exposed material in a metol-hydroquinone developer, printing of the resulting piciture on a high-contrast photosensitive material, and development of the exposed high-contrast photosensitive material.

A drawback of this prior art process is the impossibility of obtaining a picture with the optical densities of the original reproduced within an adequate range (L>1.0) when use is made of the above material with an average microcrystal linear size of 0.9 to 1.0 microns and when the exposed material is developed in a metol-hydroquinone developer.

SUMMARY OF THE INVENTION

It is an object of the present invention to provide a process for obtaining a half-tone picture of irregular structure, which will permit substantially lowering the contrast of the obtained picture and reproducing the optical densities of the original within a range of more than 1.0.

Another object of the invention is to provide a simple and easily controllable process.

With these and other objects in view, the invention resides in a process for obtaining a half-tone picture of irregular structure, which consists in exposing a silver-halide material, developing the exposed material, printing the resulting picture on a high-contrast photosensitive material, and developing the exposed high-contrast photosensitive material, and in which, according to the invention, the silver-halide material is coarse-grained, having an average linear size of silver halide microcrystals of 4 to 6 microns, and developed, after exposure in an infectious developer.

A half-tone picture obtained in this manner exhibits the advantages inherent in pictures of irregular close structure, i.e., high resolution and absence of moire formation when two or more structures are superimposed (colour reproduction). The process ensures sharply defined dots of high optical density, the distribution pattern of these dots being uniform, as far as their size is concerned. The proposed process is simple and economical, ensures stability, permits cutting down equipment costs owing to elimination of screens and associated devices, and enables high-quality pictures to be obtained.

DETAILED DESCRIPTION OF THE INVENTION

The herein-disclosed process for obtaining a half-tone picture of irregular structure is carried out as follows:

Use is made of a coarse-grained silver-halide material with an average linear size of silver halide microcrystals of 4 to 6 microns, which is developed, after exposure, in an infectious developer. The resulting picture is printed on a high-contrast photosensitive material, such as a silver-halide material of the "lith" type or a diazo material. The exposed high-contrast photosensitive material is then developed using, in the case of a "lith"-type material, for example, an infectious or any other high-contrast developer. The article "Formaldehyde-Hydroquinone Developers and Infectious Development", J.A.C., Yule, Journal, Franklin Institute March 1945, No. 3, vol. 239 discloses lith-type developers which are properly designated as "infectious lith-type developers".

The combination of a coarse-grained silver-halide material with an infectious developer leads to a superadditive effect of half-toning, as well as to a higher contrast of individual grains and groups of grains, without enhancing the contrast of the picture. As the picture is printed on a high-contrast and high-resolution photosensitive material, for example, a silver-halide material of the "lith" type, and as the exposed photosensitive material is then developed to a high contrast, a half-tone picture is obtained with the optical densities of the original being reproduced within a broad range and with fringeless dots of high optical density.

For a better understanding of the invention, the following examples of its practical embodiment are given by way of illustration.

EXAMPLE 1

A silver bromide emulsion is prepared by the two-jet technique, with an excess amount of ammonia and bromide-ion. Introduced into the emulsion are about 10% of a sodium salt of di-2-ethylhexyl ester of sulphosuccinic acid (molecular weight: 444) and 2 to 4% of polyglyceride of alkenylsuccinic acid (molecular weight: 908). The emulsion contains 63 g/l of silver. The average linear size of silver bromide microcrystals in the emulsion is 5 microns. No chemical or spectral sensitization is carried out.

The emulsion is coated on a transparent triacetate base. Transparent bases of other types may also be used. The emulsion layer is 25 microns thick.

The obtained film is used to expose thereon a picture, for example, from a continuous slide, which is done in a contact printer. The exposed film is developed in an infectious developer which is prepared by mixing the following solutions:

| Solution I | |
|---|---|
| anhydrous sodium sulphite | 0.5 g |
| trioxymethylene | 7.5 g |
| potassium metabisulphite | 2.6 g |
| anhydrous sodium carbonate | 40 g |
| water | up to 0.5 l |
| Solution II | |
| anhydrous sodium sulphite | 30 g |
| boric acid | 7.5 g |
| potassium bromide | 2.5 g |
| hydroquinone | 22.5 g |
| water | up to 0.5 l |
| Solution III | |
| polyethylene glycol | 2 g |
| water | 50 ml. |

First, solutions I and II are mixed at a ratio of 1:1, then, added to the resulting mixture is solution III in an amount of 20 ml per liter of said mixture.

It takes 4 minutes to develop the exposed film, the developer temperature being 24° C.

The characteristics of the obtained picture are as follows:

| fog density, $D_o$ | 0.06 |
|---|---|
| density range of half-tone portion, L | 1.4 |
| contrast factor of half-tone portion, | 0,5. |
| resolution, R, in $mm^{-1}$ | 25. |

The obtained picture is printed on a high-contrast phototechnical film ($\gamma = 10$, $R = 230$ $mm^{-1}$) in a contact printer and developed in an infectious developer of the above composition. The development time is 1.5 minutes, and the developer temperature is 24° C.

The characteristics of the obtained half-tone picture are as follows:

| fog density, $D_o$ | 0.04 |
|---|---|
| density range, i.e., range of reproduction of the optical densities of the original, L | 1.2 |
| resolution, R, in $mm^{-1}$ | 20. |

EXAMPLE 2

A coarse-grained silver bromide emulsion is prepared as in Example 1. In this case, the average linear size of silver bromide microcrystals is 4 microns. The subsequent steps of obtaining a half-tone picture of irregular structure are same as in Example 1.

The characteristics of the obtained half-tone picture are as follows:

| density range, i.e., range of reproduction of the optical densities of the original, L | 1.0 |
|---|---|
| resolution, R, in $mm^{-1}$ | 25. |

EXAMPLE 3

A coarse-grained silver bromide emulsion is prepared as in Example 1, whereafter chemical sensitization is carried out. To this end, added to the emulsion are 0.042 g of $Na_2S_2O_3.5H_2O$ per kg of gelatine, which is then made to ripen, at 50° C., to the optimum photosensitivity. The latter is about 10 times higher than that of the film of Example 1 and amounts to about 1 DIN.

The film is exposed and developed as described in Example 1.

The characteristics of the obtained picture are as follows:

| fog density, $D_o$ | 0.11 |
|---|---|
| density range of half-tone portion, L | 2.2 |
| contrast factor of half-tone portion, $\delta$ | 0.5 |
| resolution, R, in $mm^-$ | 30. |

The picture is printed on a high-contrast phototechnical film, with subsequent development of the exposed film as in Example 1.

The obtained half-tone picture of irregular structure features the following characteristics:

| fog density, $D_o$ | 0.04 |
|---|---|
| density range, i.e., range of reproduction of the optical densities of the original, L | 1.7 |
| resolution, R, in $mm^{-1}$ | 30. |

EXAMPLE 4

A half-tone picture of irregular structure is obtained as in Example 3 with the difference that the copy printed on a high-contrast phototechnical film is developed in a high-contrast developer of the following composition:

| metol | 2.2 g |
|---|---|
| anhydrous sodium sulphite | 96 g |
| hydroquinone | 8.8 g |
| anhydrous sodium carbonate | 48 g |
| potassium bromide | 5 g |
| water | up to 1 l. |

The development time is 5 minutes; the developer temperature is 20° C.

The obtained half-tone picture of irregular structure has the following characteristics:

| density range, i.e., range of reproduction of the optical densities of the original, L | 1.5 |
|---|---|
| resolution, R, in $mm^{-1}$ | 20. |

EXAMPLE 5

A half-tone picture of irregular structure is obtained as in Example 3 with the difference that a diazo film is used instead of a phototechnical film to print a copy. The exposed diazo film is developed in ammonia vapors for 10 minutes.

The characteristics of the obtained half-tone picture of irregular structure are as follows:

| | |
|---|---|
| fog density, $D_o$ | 0.05 |
| density range, i.e., range of reproduction of the optical densities of the original, L | 1.1 |
| resolution, R, in $mm^{-1}$ | 20. |

EXAMPLE 6

A coarse-grained silver bromide emulsion is prepared as in Example 3. In this case, the average linear size of silver bromide microcrystals is 5.7 microns. The subsequent steps of obtaining a half-tone picture of irregular structure are as in Example 3.

The characteristics of the obtained half-tone picture of irregular structure are as follows:

| | |
|---|---|
| density range, i.e., range of reproduction of the optical densities of the original, L | 1.7 |
| resolution, R, in $mm^{-1}$ | 20. |

EXAMPLE 7

For comparison with the process of the present invention, a coarse-grained silver bromide emulsion is prepared as in Example 1, with an average linear size of silver bromide microcrystals of 6.5 microns. In this case, precipitation of microcrystals takes place at the emulsion preparation stage. The subsequent steps of obtaining a half-tone picture of irregular structure are carried out as in Example 1.

The characteristics of the obtained half-tone picture of irregular structure are as follows:

| | |
|---|---|
| fog density, $D_o$ | 0.04 |
| density range, L | 1.3 |
| resolution, R, in $mm^{-1}$ | 12 |
| picture grain | coarse. |

The obtained picture is of poor quality.

What is claimed is:

1. Method of producing a printed half-tone picture of irregular structure, which comprises exposing a coarse-grained silver halide material with an average linear size of silver halide microcrystals of 4 to 6 microns, developing the thus exposed material in an infectious lith-type developer, printing the resulting picture on a high-contrast photosensitive material, and developing the exposed high-contrast photosensitive material, thereby obtaining a high quality half tone picture with the optical densities of the original being highly reproducible.

* * * * *